(12) United States Patent
Jeon et al.

(10) Patent No.: US 9,691,791 B2
(45) Date of Patent: Jun. 27, 2017

(54) DISPLAY PANEL AND DISPLAY DEVICE HAVING THE SAME

(71) Applicant: SAMSUNG DISPLAY CO., LTD., Yongin, Gyeonggi-Do (KR)

(72) Inventors: Sang Jin Jeon, Suwon-si (KR); Kwang Chul Jung, Seongnam-si (KR); Se Hyoung Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 9 days.

(21) Appl. No.: 14/728,960

(22) Filed: Jun. 2, 2015

(65) Prior Publication Data
US 2016/0035307 A1 Feb. 4, 2016

(30) Foreign Application Priority Data
Jul. 30, 2014 (KR) .................. 10-2014-0097362

(51) Int. Cl.
*H01L 27/12* (2006.01)
*G09G 3/20* (2006.01)

(52) U.S. Cl.
CPC ............ *H01L 27/124* (2013.01); *G09G 3/20* (2013.01); *G09G 2300/0426* (2013.01); *G09G 2310/0281* (2013.01); *G09G 2320/0209* (2013.01); *G09G 2320/0223* (2013.01)

(58) Field of Classification Search
CPC H01L 27/124; G09G 3/20; G09G 2320/0223; G09G 2320/0209; G09G 2300/0426
See application file for complete search history.

(56) References Cited

U.S. PATENT DOCUMENTS

| | | | |
|---|---|---|---|
| 9,122,324 B2* | 9/2015 | Kim | G06F 3/038 |
| 2006/0187722 A1* | 8/2006 | Han | G02F 1/136259 |
| | | | 365/200 |
| 2007/0146611 A1* | 6/2007 | Kang | G02F 1/13452 |
| | | | 349/149 |
| 2007/0296659 A1* | 12/2007 | Kwak | G02F 1/13452 |
| | | | 345/87 |
| 2008/0203391 A1* | 8/2008 | Kim | G02F 1/1345 |
| | | | 257/59 |

(Continued)

FOREIGN PATENT DOCUMENTS

| | | |
|---|---|---|
| KR | 10-2007-0080379 A | 8/2007 |
| KR | 10-2010-0018764 A | 2/2010 |
| KR | 10-2010-0121893 A | 11/2010 |

*Primary Examiner* — Ilana Spar
*Assistant Examiner* — Mihir K Rayan
(74) *Attorney, Agent, or Firm* — Lewis Roca Rothgerber Christie LLP (57) ABSTRACT

A display device includes: a substrate partitioned into a display area including a plurality of pixels for displaying images thereon and a non-display area around the display area; a plurality of first gate lines and a plurality of data lines extended in one direction on the display area; a plurality of pads on one side of the non-display area; a plurality of gate fan-out lines, each coupling one of the first gate lines and a corresponding one of the pads; and a plurality of data fan-out lines, each coupling one of the data lines and a corresponding one of the pads, wherein the gate fan-out lines and the data fan-out lines may be alternately disposed.

19 Claims, 4 Drawing Sheets

(56) References Cited

U.S. PATENT DOCUMENTS

| | | | | |
|---|---|---|---|---|
| 2010/0066967 A1* | 3/2010 | Takahashi | G02F 1/136286 | |
| | | | 349/143 | |
| 2010/0079717 A1* | 4/2010 | Park | G02F 1/1345 | |
| | | | 349/152 | |
| 2010/0283955 A1* | 11/2010 | Kim | G02F 1/1345 | |
| | | | 349/149 | |
| 2010/0295764 A1* | 11/2010 | Wang | G02F 1/136286 | |
| | | | 345/92 | |
| 2011/0096258 A1* | 4/2011 | Shim | G02F 1/1333 | |
| | | | 349/39 | |
| 2011/0134056 A1* | 6/2011 | Kim | G06F 3/0412 | |
| | | | 345/173 | |
| 2011/0279418 A1* | 11/2011 | Han | G02F 1/136286 | |
| | | | 345/204 | |
| 2012/0127412 A1* | 5/2012 | Lee | G02F 1/1345 | |
| | | | 349/139 | |
| 2014/0139499 A1* | 5/2014 | Hussain | H05B 33/0827 | |
| | | | 345/204 | |
| 2014/0375922 A1* | 12/2014 | Park | G02F 1/136286 | |
| | | | 349/46 | |

* cited by examiner

FIG. 1

Related Art

FIG. 2

Related Art

FIG. 3

Related Art

DISPLAY PANEL AND DISPLAY DEVICE HAVING THE SAME

CROSS-REFERENCE TO RELATED APPLICATION

This application claims priority to and the benefit of Korean Patent Application No. 10-2014-0097362, filed on Jul. 30, 2014, with the Korean Intellectual Property Office, the disclosure of which is incorporated herein in its entirety by reference.

BACKGROUND

1. Field

Aspects of embodiments of the present invention relate to a display panel including a narrow bezel and to a display device including the display panel.

2. Description of the Related Art

Display devices can be categorized into liquid crystal displays (LCDs), organic light emitting diode (OLED) displays, plasma display panels (PDPs), electrophoretic displays (EPDs), and the like, according to their light emitting methods.

In recent years, a plurality of display devices has been combined in a tiling method to realize a multi-display device having a large screen to provide a variety of information and advertisements. It is important such multi-display devices are recognized by an observer as one screen in total by minimizing or reducing non-display areas between the respective display devices.

In the related art, a narrow-bezel display device has been suggested in which a gate line and a date line are fanned out to one side of a display panel and a gate driver integrated circuit (IC) and a data driver IC are disposed on only one side of the display panel, so as to minimize or reduce a non-display area.

In this case, a gate fan-out line and a data fan-out line on one side of the display panel are insulated by an insulating layer and parasitic capacitance occurs in an overlap area between the gate fan-out line and the data fan-out line that is insulated by the insulating layer.

However, an area where the gate fan-out line and the data fan-out line overlap each other varies depending on the overlapped position, and thus a resistor capacitor (RC) delay deviation is caused, which makes it difficult to uniformly drive display devices.

It should be understood that this background section is intended to provide useful background for understanding the technology and as such disclosed herein, and as such, the background section may include ideas, concepts or recognitions that were not part of what was known or appreciated by those skilled in the pertinent art prior to a corresponding effective filing date of subject matter disclosed herein.

SUMMARY

One or more aspects of one or more embodiments of the present invention are directed to a display panel including a narrow bezel and capable of removing an RC delay deviation caused by an overlap of a gate fan-out line and a data fan-out line and to a display device including the display panel.

According to an embodiment of the present invention, a display device may include: a substrate partitioned into a display area including a plurality of pixels for displaying images thereon and a non-display area around the display area; a plurality of first gate lines and a plurality of data lines extended in one direction on the display area; a plurality of pads on one side of the non-display area; a plurality of gate fan-out lines, each coupling one of the first gate lines and a corresponding one of the pads; and a plurality of data fan-out lines, each coupling one of the data lines and a corresponding one of the pads, wherein the gate fan-out lines and the data fan-out lines may be alternately disposed.

The pads may be on only one side of the non-display area.

The gate fan-out lines may not overlap the data fan-out lines.

The gate fan-out lines and the data fan-out lines may be on a same layer.

Each of the plurality of gate fan-out lines may have substantially a same resistance value.

Each of the plurality of gate fan-out lines may have substantially a same length.

Each of the plurality of data fan-out lines may have substantially a same resistance value.

Each of the plurality of data fan-out lines may have substantially a same length.

At least one of the gate fan-out lines may correspond to a plurality of data fan-out lines.

The display panel may further include a plurality of second gate lines insulated from the first gate lines and the data lines by an insulating layer and crossing the first gate lines, wherein one of the first gate lines and a corresponding one of the second gate lines may be coupled through a contact hole in an overlap area.

According to an embodiment of the present invention, a display device may include: a substrate partitioned into a display area including a plurality of pixels for displaying images thereon and a non-display area around the display area; a plurality of first gate lines and a plurality of data lines extended in one direction on the display area; a plurality of pads on one side of the non-display area; a plurality of gate fan-out lines, each coupling one of the first gate lines and a corresponding one of the pads; a plurality of data fan-out lines, each coupling one of the data lines and a corresponding one of the pads; and at least one driver integrated circuit coupled to the plurality of pads and configured to apply scan signals and data signals, wherein the gate fan-out lines and the data fan-out lines may be alternately disposed.

The driver integrated circuit may include a gate driver logic configured to generate scan signals and a data driver logic generating data voltages.

The driver integrated circuit may include a gate driver integrated circuit and a data driver integrated circuit.

The at least one driver integrated circuits may be a plurality of driver intergrated circuits and the driver integrated circuits may be disposed at substantially equal distances from each other.

The gate fan-out lines may not overlap the data fan-out lines.

The gate fan-out lines and the data fan-out lines may be on a same layer.

Each of the plurality of gate fan-out lines may have substantially a same resistance and each of the plurality of data fan-out lines may have substantially a same resistance value.

Each of the plurality of gate fan-out lines may have a same length and each of the plurality of data fan-out lines may have substantially a same length.

At least one of the gate fan-out lines may correspond to a plurality of data fan-out lines.

The display device may further include a plurality of second gate lines insulated from the first gate lines and the data lines by an insulating layer and crossing the first gate lines, wherein one of the first gate lines and a corresponding one of the second gate lines may be coupled through a contact hole in an overlap area.

According to embodiments of the present invention, a display panel and a display device including the display panel may have a narrow bezel and may also remove the RC delay deviation caused by an overlap of a gate fan-out line and a data fan-out line.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of embodiments of the present invention will be more clearly understood from the following detailed description taken in conjunction with the accompanying drawings, in which.

DETAILED DESCRIPTION

Hereinafter, embodiments of the present disclosure of invention will be described in more detail with reference to the accompanying drawings.

Although the present invention can be modified in various manners and have several embodiments, specific embodiments are illustrated in the accompanying drawings and will be mainly described in the specification. However, the scope of the embodiments of the present invention is not limited to the specific embodiments and should be construed as including all the changes, equivalents, and substitutions included in the spirit and scope of the present invention.

Throughout the specification, when an element is referred to as being "on," "connected to," or "coupled to" another element or layer, the element or layer may be directly "on," connected to," or "coupled to" the other element or layer, "electrically connected" or "electrically coupled" to the other element or layer, or one or more intervening elements or layers may be interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Expressions such as "at least one of," when preceding a list of elements, modify the entire list of elements and do not modify the individual elements of the list. Further, the use of "may" when describing embodiments of the inventive concept refers to "one or more embodiments of the inventive concept."

As used herein, the terms "use," "using," and "used" may be considered synonymous with the terms "utilize," "utilizing," and "utilized," respectively.

As used herein, the term "substantially," "about," and similar terms are used as terms of approximation and not as terms of degree, and are intended to account for the inherent deviations in measured or calculated values that would be recognized by those of ordinary skill in the art.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Some of the parts which are not associated with the description may not be provided in order to specifically describe embodiments of the present invention, and like reference numerals refer to like elements throughout the specification.

Hereinafter, it is assumed that a liquid crystal display (LCD) is used as a display device according to an embodiment of the present invention. However, it will be apparent to one of ordinary skill in the art that embodiments of the present invention can be applied to an organic light emitting diode (OLED) display device, a plasma display panel (PDP) display device, or another display device other than the LCD, OLED, and PDP.

Figure 1:
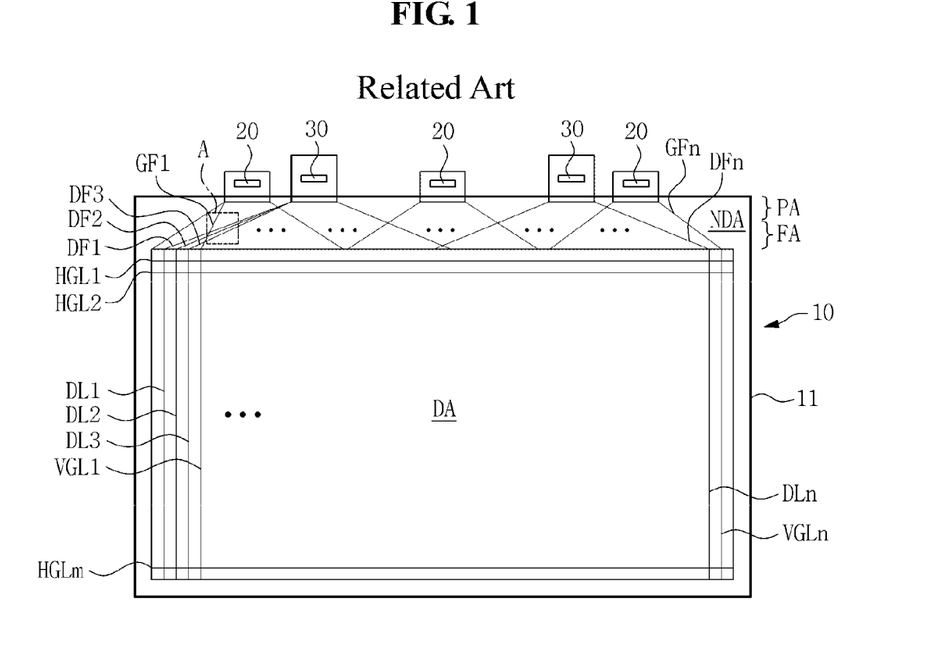
FIG. 1 is a schematic plan view illustrating a related art display device.

FIG. 1 is a schematic plan view illustrating a related art display device.

Referring to FIG. 1, a related art display device includes a display panel 10 and a plurality of gate driver integrated circuits (ICs) 20 and a plurality of data driver integrated circuits (ICs) 30 connected (e.g., coupled) to one side of the display panel 10. The related art display device refers to a display device including the gate driver ICs 20 and the data driver ICs 30 disposed on only one side of the display panel 10.

The display panel 10 may include a first substrate 11, a second substrate disposed to face the first substrate 11, and a liquid crystal layer disposed between the first substrate 11 and the second substrate. For ease of description, the second substrate and the liquid crystal layer are omitted in FIG. 1.

The first substrate 11 may be partitioned into a display area DA on which a plurality of pixels for displaying images are disposed and a non-display area NDA around the display area DA.

The display panel 10 includes a plurality of pixels disposed on the display area DA of the first substrate 11, a plurality of first gate lines VGL1~VGLn and a plurality of second gate lines HGL1~HGLm applying scan signals to the respective pixels, and a plurality of data lines DL1~DLn applying data voltages to the respective pixels.

Further, the display panel 10 may include a plurality of pads disposed on the non-display area NDA of the first substrate 11, a plurality of gate fan-out lines GF1~GFn connecting (or coupling) the plurality of first gate lines VGL1~VGLn and the plurality of pads in one-to-one correspondence, and a plurality of data fan-out lines DF1~DFn connecting (or coupling) the plurality of data lines DL1~DLn and the plurality of pads in one-to-one correspondence.

Hereinafter, for ease of description, a pad unit PA refers to the non-display area NDA on which the plurality of pads are disposed and a fan-out unit FA refers to the non-display area NDA on which the plurality of gate fan-out lines GF1~GFn and the plurality of data fan-out lines DF1~DFn are disposed.

The plurality of gate fan-out lines GF1~GFn and the plurality of data fan-out lines DF1~DFn disposed on the fate-out unit FA may be electrically separated from each other by an insulating layer.

Figure 2:
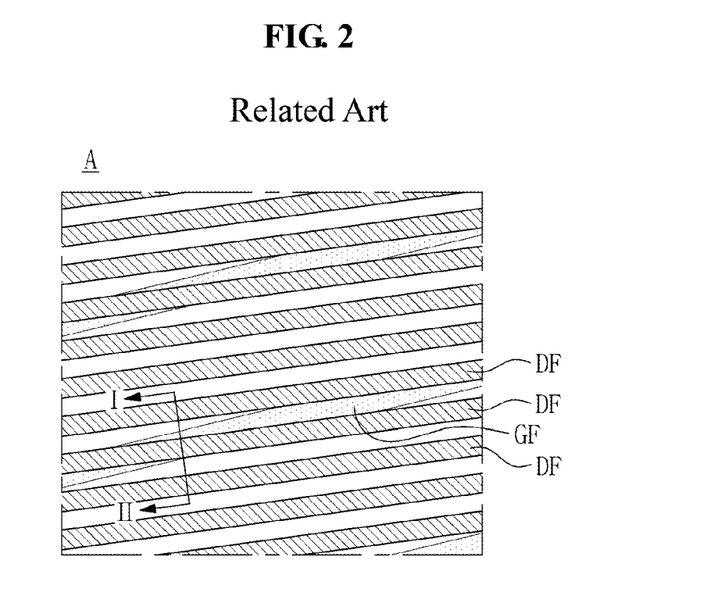
FIG. 2 is a plan view enlarging a part (an "A" area) of a fan-out unit of FIG. 1.
Figure 3:
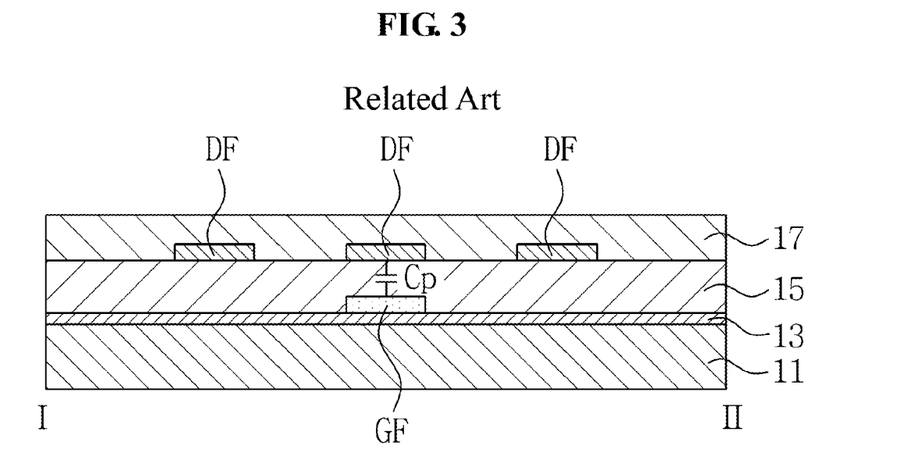
FIG. 3 is a cross-sectional view taken along a line I-II of FIG. 2.

FIG. 2 is a plan view enlarging a part (an "A" area) of the fan-out unit of FIG. 1 and FIG. 3 is a cross-sectional view taken along a line I-II of FIG. 2.

Referring to FIGS. 2 and 3, the display panel 10 may include the first substrate 11, a buffer layer 13 on the first substrate 11, a gate fan-out line GF on the buffer layer 13, a gate insulating film 15 on the gate fan-out line GF, a data fan-out line DF on the gate insulating film 15, an interlayer insulating film 17 on the data fan-out line DF, and the like.

In this case, parasitic capacitance Cp occurs in an overlap area between the gate fan-out line GF and the data fan-out line DF insulated by the gate insulating film 15.

However, an area where the gate fan-out line GF and the data fan-out line DF overlap each other varies depending on the overlapped position in the fan out unit FA, which results in an RC delay deviation.

The RC delay refers to a delay caused by time for charging or discharging a capacitor in a circuit including a resistor and the capacitor.

That is, the related art display device has the RC delay deviation in the data fan-out line transmitting data voltage signals to the respective data lines, which makes it difficult to uniformly drive display devices.

Figure 4:
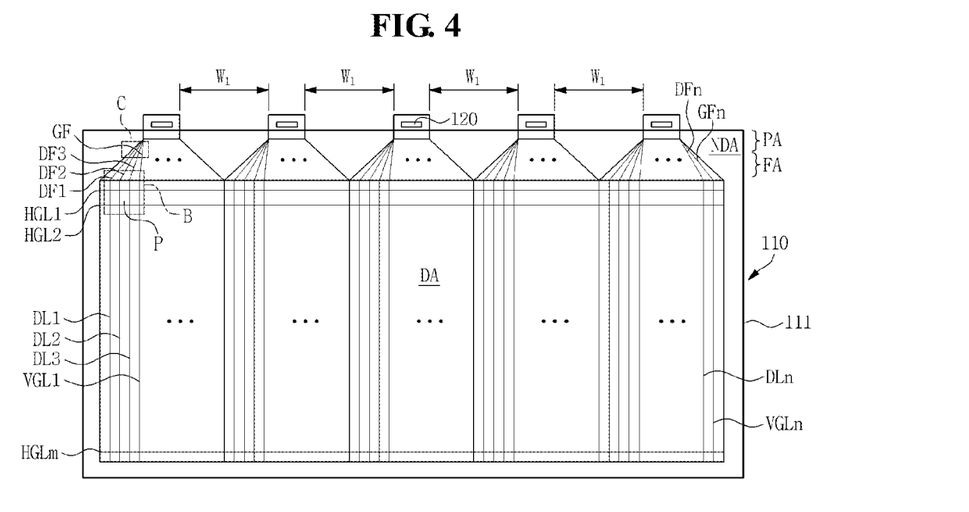
FIG. 4 is a schematic plan view illustrating a display device according to an embodiment of the present invention.
Figure 5:
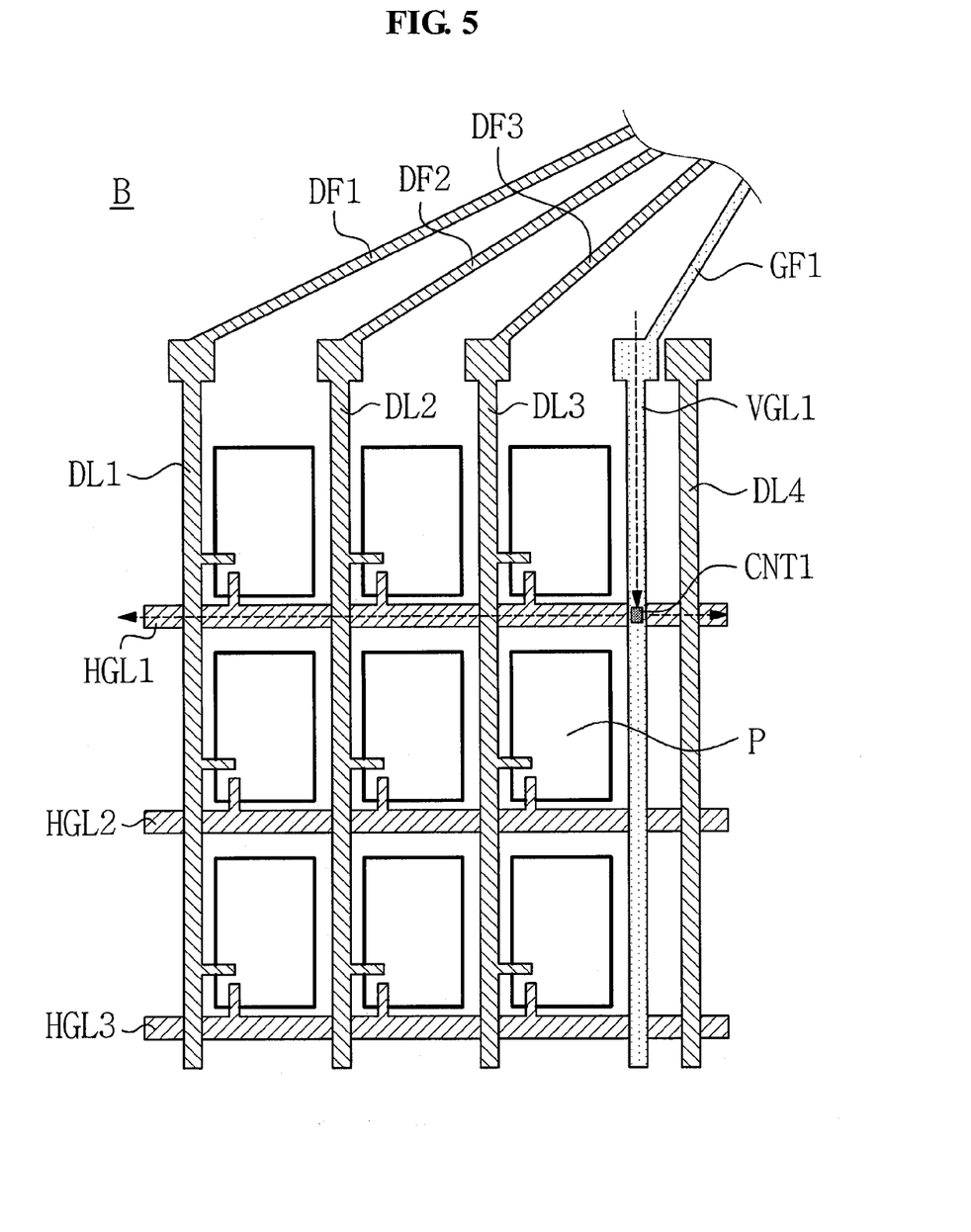
FIG. 5 is a schematic plan view enlarging a part (a "B" area) of a display area of FIG. 4.

FIG. 4 is a schematic plan view illustrating a display device according to an embodiment of the present invention, and FIG. 5 is a schematic cross-sectional view enlarging a part (a "B" area) of a display area of FIG. 4.

Referring to FIGS. 4 and 5, the display device according to an embodiment of the present invention includes a display panel 110, and a driver IC 120 connected (e.g., coupled) to one side of the display panel 110.

The display device according to an embodiment of the present invention is a narrow-bezel display device on which the driver IC 120 is disposed on only one side of the display panel 110. FIG. 4 illustrates that the driver IC 120 is disposed on an upper side of the display panel 110. However, embodiments of the present invention are not limited thereto, and thus the driver IC 120 may be disposed on a lower side, a left side, or a right side of the display panel 110.

The display panel 110 may include a first substrate 111, a second substrate disposed to face the first substrate 111, and a liquid crystal layer disposed between the first substrate 111 and the second substrate. For ease of description, the second substrate and the liquid crystal layer are omitted in FIG. 4.

The first substrate 111 may be partitioned into a display area DA on which a plurality of pixels P for displaying images is disposed and a non-display area NDA around the display area DA.

The display panel 110 includes a plurality of pixels P disposed on the display area DA of the first substrate 111 in a matrix form m×n, a plurality of first gate lines VGL1~VGLn and a plurality of second gate lines HGL1~HGLm applying scan signals to the respective pixels, and a plurality of data lines DL1~DLn applying data voltages to the respective pixels. The display panel 110 may include a plurality of pixels P arranged in many different structures other than the matrix form m×n.

The plurality of first gate lines VGL1~VGLn and the plurality of data lines DL1~DLn are extended in one direction on the display area DA of the first substrate 111. Further, the plurality of second gate lines HGL1~HGLm are insulated from the plurality of the first gate lines VGL1~VGLn and the data lines DL1~DLn by the insulating layer and extended in a direction to cross (e.g., intersect) with the first gate lines VGL1~VGLn and the data lines DL1~DLn.

In addition, the display panel 110 may include a plurality of pads disposed on the non-display area NDA of the first substrate 111, a plurality of gate fan-out lines GF1~GFn connecting (coupling) the plurality of first gate lines VGL1~VGLn and the plurality of pads in one-to-one correspondence, and a plurality of data fan-out lines DF1~DFn connecting (coupling) the plurality of first gate lines DL1~DLn and the plurality of pads in one-to-one correspondence.

Hereinafter, for ease of description, a pad unit PA refers to the non-display area NDA on which the plurality of pads are disposed and a fan-out unit FA refers to the non-display area NDA on which the plurality of gate fan-out lines GF1~GFn and the plurality of data fan-out lines DF1~DFn are disposed.

The display device according to an embodiment of the present invention may include at least one driver IC 120 connected (e.g., coupled) to the pad unit PA of the display panel 110 and applying scan signals and data voltage signals.

The driver IC 120 according to an embodiment of the present invention may be an integrated circuit (IC) on which a gate driver logic for generating scan signals and a data driver logic for generating data voltages are merged into a single chip.

Further, a driver IC 120 according to another embodiment of the present invention may be an IC on which a gate driver IC for generating scan signals and a data driver IC for generating data voltages are merged into a single chip.

Thus, the driver IC 120 may concurrently generate the scan signal and the data voltage signal, such that the respective driver ICs 120 may be disposed at an equal (e.g., substantially equal) distance W1 from each other, such that the respective driver ICs 120 are connected (coupled) to the same (e.g., substantially the same) number of fan-out lines.

That is, the driver ICs 120 may be disposed to be connected (coupled) to the fan-out lines, the number of which is a result of dividing a total number of the plurality of gate fan-out lines GF and the plurality of data fan-out lines DF disposed on the fan-out unit FA of the display panel 110 by a total number of the driver ICs 120 disposed on the pad unit PA.

For example, in a case where a total number of the plurality of gate fan-out lines GF and the plurality of data fan-out lines DF disposed on the fan-out unit FA of the display panel 110 is 3000 and a total number of the driver ICs 120 disposed on the pad unit PA is 5, the driver ICs 120 may be disposed at equal (e.g., substantially equal) distances to be connected (coupled) to 600 fan-out lines.

In addition, FIG. 4 illustrates that the driver IC 120 has a chip on film (COF) structure connected (coupled) to the pad unit PA through a flexible printed circuit board. However, embodiments of the present invention are not limited thereto, and thus the driver IC 120 may have a chip on glass (COG) structure directly mounted on the first substrate 111.

Referring to FIG. 5, the first gate line VGL1 and the second gate line HGL1 may be electrically connected (coupled) to each other in an overlapping area through a contact hole CNT1.

The scan signal applied over the first gate line VGL1 may be transmitted to the respective pixels over the second gate line HGL1 electrically connected (coupled) to the first gate line VGL1 through the contact hole CNT1.

Figure 6:
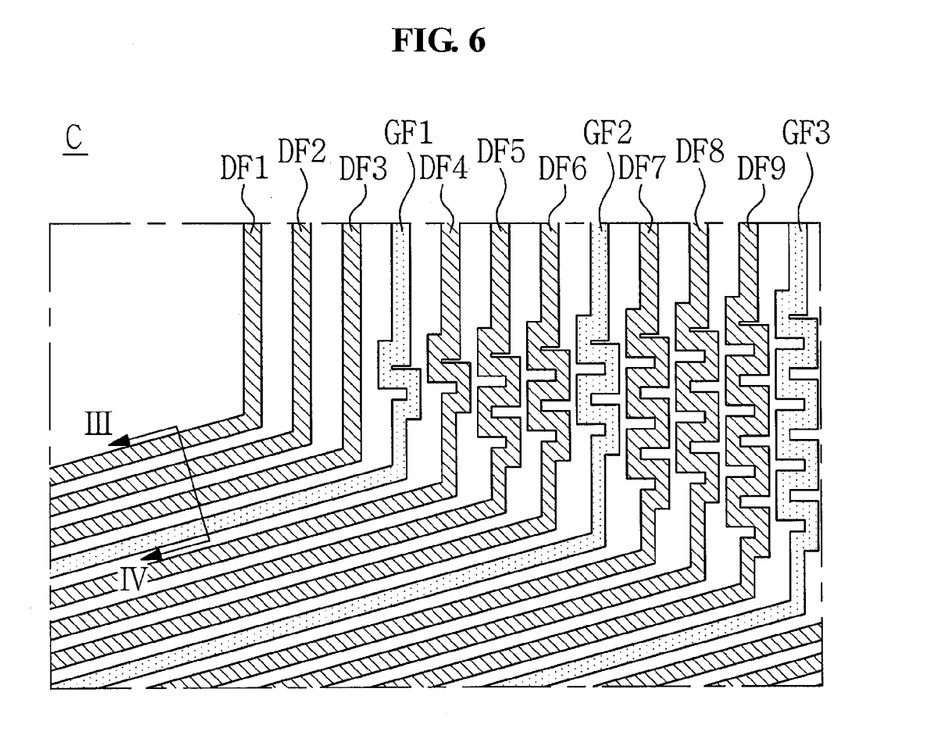
FIG. 6 is a schematic plan view enlarging a part (a "C" area) of a fan-out unit of FIG. 4.

FIG. 6 is a schematic cross-sectional view enlarging a part (a "C" area) of a fan-out unit of FIG. 4.

Referring to FIG. 6, the plurality of gate fan-out lines GF1~GFn and the plurality of data fan-out lines DF1~DFn disposed on the fan-out unit FA may be alternately disposed.

FIG. 6 illustrates that one gate fan-out line GF1 is disposed corresponding to three data fan-out lines DF1~DF3, but embodiments of the present invention are not limited thereto.

The plurality of gate fan-out lines GF1~GFn and the plurality of data fan-out lines DF1~DFn may be alternately disposed, respectively.

Further, one gate fan-out line GF1~GFn and a plurality of data fan-out lines DF1~DFn may be disposed to form a unit.

The plurality of gate fan-out lines GF1~GFn and the plurality of data fan-out lines DF1~DFn disposed on the fan-out unit FA may be disposed in various suitable forms according to an arrangement order of the first gate line and the data line disposed on the display area DA.

Further, the plurality of gate fan-out lines GF1~GFn and the plurality of data fan-out lines DF1~DFn disposed on the fan-out unit FA may respectively have the same (e.g., substantially the same) length.

As a distance in a straight line between the first gate line and the corresponding pad is reduced, the gate fan-out line connecting (coupling) therebetween is reduced. Likewise, as a distance in a straight line between the plurality of data lines and the corresponding pad is reduced, the data fan-out line connecting (coupling) therebetween is reduced.

As a result, the RC delay deviation may occur due to a difference in length (resistance) according to a position of the gate fan-out line and the data fan-out line.

Therefore, the gate fan-out line and the data fan-out line may be patterned in a zigzag as illustrated in FIG. 6, in order to minimize or reduce the length difference according to the position of the gate fan-out line and the data fan-out line.

That is, as the distance in a straight line between the first gate line and the corresponding pad (or the distance in a straight line between the plurality of data lines and the corresponding pad) is reduced, the length of the gate fan-out line (or the data fan-out line) connecting (coupling) therebetween is elongated by increasing the number of zigzag patterns.

As a result, the plurality of gate fan-out lines GF and the plurality of data fan-out lines DF may respectively have the same (e.g., substantially the same) length and the RC delay deviation caused by the length (resistance) difference between the respective gate fan-out lines and data fan-out lines may be prevented or reduced.

Figure 7:
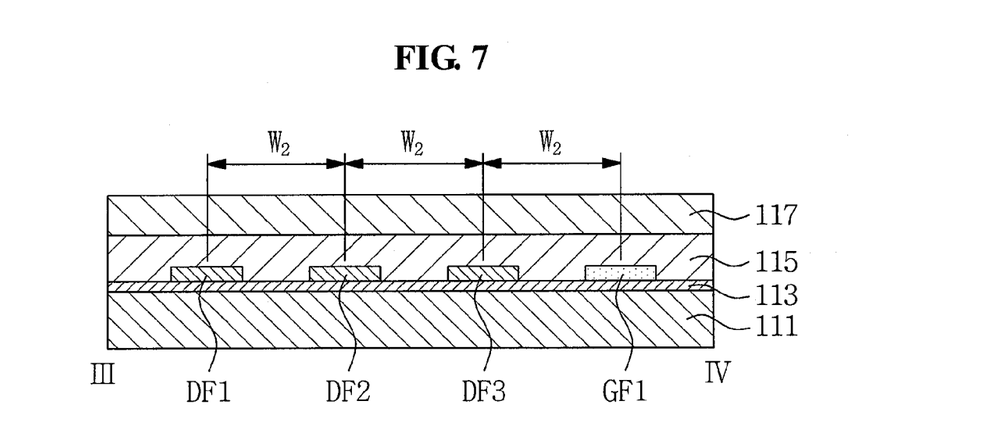
FIG. 7 is a cross-sectional view taken along a line III-IV of FIG. 6.

FIG. 7 is a cross-sectional view taken along a line III-IV of FIG. 6.

Referring to FIG. 7, the display panel 110 according to an embodiment of the present invention may include the first substrate 111, a buffer layer 113 on the first substrate 111, the gate fan-out line GF1 and the data fan-out lines DF1~DF3 disposed on the buffer layer 113 and spaced apart from each other, a gate insulating film 115 on the gate fan-out line GF1 and the data fan-out lines DF1~DF3, and an interlayer insulating film 117 on the gate insulating film 115.

The plurality of gate fan-out lines GF1~GFn and the plurality of data fan-out lines DF1~DFn disposed on the fan-out unit FA are disposed on the same layer.

Further, the plurality of gate fan-out lines GF1~GFn and the data fan-out lines DF1~DFn disposed on the fan-out unit FA are disposed at a substantially equal (e.g., equal) distance W2 from each other.

Thus, the plurality of gate fan-out lines GF1~GFn and the plurality of data fan-out lines DF1~DFn according to an embodiment of the present invention are respectively disposed at substantially equal (e.g., equal) distances from each other on the same layer and have substantially the same (e.g., the same) length, and thus the uniform RC delay may be caused on the respective fan-out lines, thereby capable of applying uniform scan signals and data voltage signals.

From the foregoing, it will be appreciated that various embodiments in accordance with the present disclosure have been described herein for purposes of illustration, and that various modifications may be made without departing from the scope and spirit of the present invention. Accordingly, the various embodiments disclosed herein are not intended to limit the scope and spirit of the present invention as set forth in the following claims and their equivalents.

What is claimed is:

1. A display panel comprising:
a substrate partitioned into a display area comprising a plurality of pixels for displaying images thereon and a non-display area around the display area;
a plurality of first gate lines and a plurality of data lines extended in one direction on the display area;
a plurality of pads on one side of the non-display area;
a plurality of gate fan-out lines, each coupling one of the first gate lines and a corresponding one of the pads; and
a plurality of data fan-out lines, each coupling one of the data lines and a corresponding one of the pads,
wherein the gate fan-out lines and the data fan-out lines are alternately disposed, and
wherein the gate fan-out lines do not overlap the data fan-out lines.

2. The display panel of claim 1, wherein the pads are on only one side of the non-display area.

3. The display panel of claim 1, wherein the gate fan-out lines and the data fan-out lines are on a same layer.

4. The display panel of claim 1, wherein each of the plurality of gate fan-out lines has substantially a same resistance value.

5. The display panel of claim 4, wherein each of the plurality of gate fan-out lines has substantially a same length.

6. The display panel of claim 1, wherein each of the plurality of data fan-out lines has substantially a same resistance value.

7. The display panel of claim 6, wherein each of the plurality of data fan-out lines has substantially a same length.

8. The display panel of claim 1, wherein at least one of the gate fan-out lines corresponds to a plurality of data fan-out lines.

9. The display panel of claim 1, further comprising a plurality of second gate lines insulated from the first gate lines and the data lines by an insulating layer and crossing the first gate lines,
wherein one of the first gate lines and a corresponding one of the second gate lines are coupled through a contact hole in an overlap area.

10. A display device comprising:
a substrate partitioned into a display area comprising a plurality of pixels for displaying images thereon and a non-display area around the display area;

a plurality of first gate lines and a plurality of data lines extended in one direction on the display area;
a plurality of pads on one side of the non-display area;
a plurality of gate fan-out lines, each coupling one of the first gate lines and a corresponding one of the pads;
a plurality of data fan-out lines, each coupling one of the data lines and a corresponding one of the pads; and
at least one driver integrated circuit coupled to the plurality of pads and configured to apply scan signals and data signals,
wherein the gate fan-out lines and the data fan-out lines are alternately disposed, and
wherein the gate fan-out lines do not overlap the data fan-out lines.

11. The display device of claim 10, wherein the driver integrated circuit comprises:
a gate driver logic configured to generate scan signals, and
a data driver logic configured to generate data voltages.

12. The display device of claim 10, wherein the driver integrated circuit comprises:
a gate driver integrated circuit, and
a data driver integrated circuit.

13. The display device of claim 10,
wherein the at least one driver integrated circuit comprises a plurality of driver integrated circuits, and
wherein the driver integrated circuits are at substantially equal distances from each other.

14. The display device of claim 10, wherein the gate fan-out lines and the data fan-out lines are on a same layer.

15. The display device of claim 10,
wherein each of the plurality of gate fan-out lines has substantially a same resistance value, and
wherein each of the plurality of data fan-out lines has substantially a same resistance value.

16. The display device of claim 15,
wherein each of the plurality of gate fan-out lines has substantially a same length, and
wherein each of the plurality of data fan-out lines has substantially a same length.

17. The display device of claim 10, wherein at least one of the gate fan-out lines corresponds to a plurality of data fan-out lines.

18. The display device of claim 10, further comprising:
a plurality of second gate lines insulated from the first gate lines and the data lines by an insulating layer and crossing the first gate lines,
wherein one of the first gate lines and a corresponding one of the second gate lines are coupled through a contact hole in an overlap area.

19. A display panel comprising:
a substrate partitioned into a display area comprising a plurality of pixels for displaying images thereon and a non-display area around the display area;
a plurality of first gate lines and a plurality of data lines extended in one direction on the display area;
a plurality of pads on one side of the non-display area;
a plurality of gate fan-out lines, each coupling one of the first gate lines and a corresponding one of the pads; and
a plurality of data fan-out lines, each coupling one of the data lines and a corresponding one of the pads,
wherein the gate fan-out lines and the data fan-out lines are alternately disposed, and
wherein the gate fan-out lines and the data fan-out lines are on a same layer.

* * * * *